(12) United States Patent
Pahl

(10) Patent No.: US 11,444,015 B2
(45) Date of Patent: Sep. 13, 2022

(54) ELECTRONIC DEVICE WITH STUD BUMPS

(71) Applicant: TDK Corporation, Tokyo (JP)

(72) Inventor: Wolfgang Pahl, Munich (DE)

(73) Assignee: TDK Corporation, Tokyo (JP)

( * ) Notice: Subject to any disclaimer, the term of this patent is extended or adjusted under 35 U.S.C. 154(b) by 7 days.

(21) Appl. No.: 17/127,100

(22) Filed: Dec. 18, 2020

(65) Prior Publication Data

US 2021/0104456 A1   Apr. 8, 2021

Related U.S. Application Data

(63) Continuation of application No. 16/285,546, filed on Feb. 26, 2019, now Pat. No. 10,903,156.

(30) Foreign Application Priority Data

Feb. 26, 2018   (DE) .......................... 102018104279.5

(51) Int. Cl.
*H01L 23/498* (2006.01)
*H01L 21/56* (2006.01)
*H01L 23/00* (2006.01)
*H01L 23/31* (2006.01)

(52) U.S. Cl.
CPC ...... *H01L 23/49838* (2013.01); *H01L 21/563* (2013.01); *H01L 23/3171* (2013.01); *H01L 23/3185* (2013.01); *H01L 23/49816* (2013.01); *H01L 23/49894* (2013.01); *H01L 24/14* (2013.01); *H01L 24/81* (2013.01); *H01L 2224/14* (2013.01);

(Continued)

(58) Field of Classification Search
CPC ............... H01L 21/563; H01L 23/3171; H01L 23/3185; H01L 23/49816; H01L 23/49838; H01L 23/49894; H01L 24/14; H01L 24/81; H01L 2224/14; H01L 2224/16225; H01L 2924/1461
See application file for complete search history.

(56) References Cited

U.S. PATENT DOCUMENTS

| 6,245,594 B1 * | 6/2001 | Wu ......................... H01L 24/81 |
| | | 257/E21.511 |
| 6,335,271 B1 * | 1/2002 | Fukuyama .............. H01L 24/11 |
| | | 438/615 |
| 6,492,194 B1 | 12/2002 | Bureau et al. |

(Continued)

FOREIGN PATENT DOCUMENTS

| DE | 10016132 A1 | 10/2001 |
| DE | 102010054782 A1 | 6/2012 |

(Continued)

*Primary Examiner* — Matthew E Warren
(74) *Attorney, Agent, or Firm* — Slater Matsil, LLP

(57) ABSTRACT

An electronic device with stud bumps is disclosed. In an embodiment an electronic device includes a carrier board having an upper surface and an electronic chip mounted on the upper surface, the electronic chip having a mounting side facing the upper surface of the carrier board, a top side facing away from the upper surface, and sidewalls connecting the mounting side to the top side, wherein the electronic chip has equal to or less than 5 stud bumps per square millimeter of a base area of the mounting side, wherein the carrier board has at least one recess in the upper surface, and wherein at least one of the stud bumps reaches into the recess.

16 Claims, 3 Drawing Sheets

(52) U.S. Cl.
CPC ............... *H01L 2224/16225* (2013.01); *H01L 2224/8185* (2013.01); *H01L 2924/1461* (2013.01)

(56) References Cited

U.S. PATENT DOCUMENTS

| | | |
|---|---|---|
| 7,312,533 B2 | 12/2007 | Haimerl et al. |
| 7,652,374 B2 | 1/2010 | Kok et al. |
| 9,556,022 B2 | 1/2017 | Pahl |
| 10,154,582 B2 | 12/2018 | Pahl et al. |
| 2003/0136814 A1* | 7/2003 | Furman .................. H01L 24/16 257/E21.174 |
| 2005/0005411 A1 | 1/2005 | Kawauchi et al. |
| 2006/0151203 A1 | 7/2006 | Krueger et al. |
| 2007/0069354 A1 | 3/2007 | Dangelmaier et al. |
| 2008/0308314 A1 | 12/2008 | Sasaki |
| 2011/0278741 A1 | 11/2011 | Chug et al. |
| 2011/0309492 A1* | 12/2011 | Chi ..................... H01L 23/3171 257/737 |
| 2012/0039056 A1 | 2/2012 | Oppermann et al. |
| 2012/0093346 A1 | 4/2012 | Feiertag et al. |
| 2014/0036466 A1 | 2/2014 | Pahl et al. |
| 2015/0091160 A1 | 4/2015 | Reber |
| 2016/0049918 A1* | 2/2016 | Moulard ............ H03H 9/02244 333/186 |
| 2016/0100489 A1 | 4/2016 | Costa et al. |
| 2016/0225706 A1* | 8/2016 | Cho ........................ H01L 24/16 |
| 2019/0131266 A1* | 5/2019 | Aoki ..................... G02B 6/1221 |

FOREIGN PATENT DOCUMENTS

| | | | |
|---|---|---|---|
| JP | H10107083 A | 4/1998 | |
| JP | 2006196932 A | 7/2006 | |
| JP | 2008311584 A | 12/2008 | |
| JP | 2009267067 A | 11/2009 | |
| JP | 2009545180 A | 12/2009 | |
| JP | 2012146769 A | 8/2012 | |
| JP | 2012244003 A | 12/2012 | |
| JP | 2016523725 A | 8/2016 | |
| KR | 20160020832 A * | 2/2016 | ....... H01L 23/49838 |
| WO | 2016165882 A1 | 10/2016 | |

* cited by examiner

ELECTRONIC DEVICE WITH STUD BUMPS

CROSS-REFERENCE TO RELATED APPLICATIONS

This is a continuation application of U.S. application Ser. No. 16/285,546, entitled "Electronic Device with Stud Bumps," filed on Feb. 26, 2019, which claims the priority of German patent application 102018104279.5, filed Feb. 26, 2018, all of which are incorporated herein by reference in its entirety.

TECHNICAL FIELD

Embodiments of the present invention relate to an electronic device, in particular an electronic device comprising a carrier and an electronic chip mounted on the carrier. The electronic device can be, for instance, a sensor device comprising a MEMS (microelectromechanical system) chip. For example, the electronic device can be a MEMS microphone.

BACKGROUND

MEMS microphones make use of microstructured, mostly silicon-based acoustoelectric transducers. These highly sensitive sensor chips deploy thin moveable membranes, making them also very sensitive to mechanical stress from their assembly in a protective package. The most common way to keep such stress on a low level is to use a conventional die attach with a soft and thick bondline. In that case, the membrane and thus the electrical contacts are positioned upright, and the internal electrical interconnections to the package and/or a complementing ASIC (application-specific integrated circuit) are done by wire bonding. This leads to two major disadvantages: In the case of the dominating bottom port configuration, the MEMS internal cavity cannot contribute to the (beneficial) acoustic back volume but adds up to the (parasitic) front volume, both impairing the performance of the microphone. Moreover, the bond wires require quite a lot of lateral space (for the substrate landings) and headroom (for the wire loop and a safety margin towards the cap), both increasing the dimensions of the component, which compromises the general miniaturization efforts.

Flip chip assembly on solder bumps is a common trend in microelectronics that could provide a solution for both said issues. But in this case, in turn, the sensor chip is rigidly coupled to the package substrate, making it prone to be influenced by static assembly stress, offset from solder re-melting, temperature induced stress due to CTE mismatch between sensor and package materials, and dynamic stress from external impacts.

Thus, for example, for the described microphone application, a packaging solution is needed for a bottom port microphone using internal flip chip assembly for the MEMS sensor without detrimental stress effects.

SUMMARY

Embodiments provide an electronic device that avoids or at least reduces the above-mentioned problems.

According to at least one embodiment, an electronic device comprises a carrier board having an upper surface. An electronic chip is mounted on the upper surface of the carrier board. The electronic chip can, for example, be a sensor chip. In a preferred embodiment, the electronic chip can be a MEMS chip.

The carrier board can preferably provide electrical connections for connecting the electronic chip. In particular, the carrier board can be a laminated multilayer board, which can be based on HTCC (high temperature co-fired ceramic), LTCC (low temperature co-fired ceramic), polymer materials and/or glass. Conductor lines and/or vias can provide electrical routing between the elements mounted on the carrier board and external solder pads.

The electronic chip can have a mounting side facing the upper surface of the carrier board. In particular, the chip can have connection elements on the mounting side, the connection elements embodied for electrical connecting and mounting the chip on the upper surface of the carrier board. Furthermore, the electronic chip can have a top side facing away from the upper surface of the carrier board and sidewalls connecting the mounting side to the top side.

According to a further embodiment, the electronic chip has, as connection elements on the mounting side, stud bumps. The stud bumps can, for example, be located on electrode pads of the electronic chip. To create a stud bump, a ball is formed using a standard ball bumping process. After the ball is bonded to the electrode pad, wire clamps are closed and the bondhead moves to tear the wire. If the move is directed substantially perpendicular to the mounting side, a "tail" can be left on top of the bump. Depending on the move parameters, the width and the length of the tail and, thus, the size and shape of the stud bump can be adjusted. Each of the stud bumps can form an electro-mechanical joining element that can combine inherent flexibility, a low profile, and a small footprint.

The mounting side can be delimited by the chip outline, so that the area enclosed by the chip outline can be denoted as a base area of the electronic chip. In particular, the electronic chip can particularly preferably have equal to or less than 5 stud bumps per square millimeter of a base area of the mounting side. In simple words, the electronic chip can be equipped with only a few stud bumps, for example, equal to or less than 10 stud bumps. By way of example, a square-shaped or rectangular electronic chip can have four stud bumps, each of which is located in one of the corners of the square-shaped or rectangular base area. Furthermore, in each of the corners for instance two stud bumps can be applied, resulting in an electronic chip with eight stud bumps.

According to a further embodiment, the stud bumps are connected to the upper surface of the carrier by means of an electrically conductive adhesive. The conductive adhesive can be applied by dipping the stud bumps in a "wet" adhesive layer of controlled thickness before placing the electronic chip onto the carrier board. Furthermore, deposition of the conductive adhesive by printing, jetting or dispensing can provide higher volumes at better reproducibility. Advantageously, the use of the conductive adhesive provides a moderate temperature profile. While lead-free solder bumps require typically temperatures of about 250° C. for reflow processes, typical conductive adhesives cure at about 150° C. or less, and even temperatures of about 60° C. are possible. Therefore, only a low initial stress level is introduced during the chip mounting.

The conductive adhesive can be a thermoplastic or thermosetting resin, comprising one or more chosen from silicone, acrylate, epoxy and other resin materials, filled with electrically conductive particles. Typically Ag and/or Pd can be used. In case of MEMS microphones or other capacitive sensors, a relatively high joint resistivity of up to a kOhm range may be tolerable. In this case, other filler materials like carbon can also be possible. Also, inherently conductive polymers can be chosen as conductive adhesive.

According to a further embodiment, the carrier board has at least one recess in the upper surface, wherein at least one stud bump reaches into the recess. In particular, the tail of the stud bump can be accommodated in the recess. Preferably, the carrier board comprises a recess for each of the stud bumps. The recess(es) can be filled by the conductive adhesive.

Furthermore, at least one or several or all of the stud bumps have a form-locking profile. Such form-locking profile of a stud bump and, in particular, its tail can provide a stronger anchoring in the relatively soft conductive adhesive. For example, the tail can be bent at the end, or can be formed as a hook or a bracket. Also, coining the tail to a mushroom shape is a possibility.

Preferably, at least one or several or all of the stud bumps has/have a height of equal to or greater than 30 µm and equal to or less than 180 µm. The height can include in particular the tail as well as an optional portion accommodated in a recess of the carrier board. The stud bumps can be manufactured, for example, from a gold wire with a diameter of equal to or greater than 12 µm and equal to or less than 30 µm. Such stud bumps can be produced as explained above by a modified wire bonding equipment and can be set at high rates of up to ~30/s directly on electrode pads as, for instance, Al pads, and do not require expensive UBM (under bump metallization) processing, which, for example, is often undesired in connection with MEMS wafer processes.

According to a further embodiment, the electronic device comprises a laminated polymer hood. The polymer hood at least partly covers the top side of the electronic chip and extends onto the upper surface of the carrier board. This can mean, in particular, that the polymer hood is fixedly connected, for example, by an adhesive force, to a part of the upper surface. The polymer hood can be embodied to mechanically hold the electronic chip on the carrier board.

Furthermore, the polymer hood can cover a majority of the sidewalls of the electronic chip. In case of a square-shaped or rectangular chip, the polymer hood can preferably cover at least three of the four sidewalls of the electronic chip.

The polymer hood can be manufactured by laminating a polymer foil at least partly onto the electronic chip mounted on the carrier board, and partly onto the upper surface of the carrier board. The lamination process can preferably be based on a heat-enhanced deep drawing process driven by an air pressure difference above and below the foil. The polymer material of the laminated foil and, thus, the polymer hood, can be selected from a wide range of thermoplastic or thermosetting polymers. Particularly preferably, the polymer hood comprises a B-stage material, which is known to a person skilled in the art and which combines a workability under thermoplastic conditions with a transformation to a thermosetting status during a final thermal and/or radiative cure. Preferably, the polymer hood has a thickness of equal to or greater than 10 µm and equal to or less than 80 µm. A preferred thickness can be about 20 µm. In order to not compromise the flexibility of the assembly, i.e., the electronic device, the polymer hood, i.e., the laminated foil in the cured and finalized state constituting the polymer hood, preferably has a Young's modulus of equal to or less than 1 GPa at room temperature.

According to a further embodiment, the mounting side of the electronic chip is located at a distance from the upper surface of the carrier board, thereby defining a clearance between the mounting side and the upper surface. The height of the clearance can be determined substantially by the height of the stud bumps, minus the height of that part of the stud bumps, which is located in a recess, if applicable. In particular, the clearance can be free of any underfill material. In other words, the electronic chip can be mounted and fixed on the carrier board only by means of the stud bumps with the conductive adhesive and the polymer hood, wherein any further underfill material, for example, adhesive materials that are often applied between a chip and a substrate, can be avoided.

BRIEF DESCRIPTION OF THE DRAWINGS

Further features, advantages and expediencies will become apparent from the following description of exemplary embodiments in conjunction with the figures.

In the figures, elements of the same design and/or function are identified by the same reference numerals. It is to be understood that the embodiments shown in the figures are illustrative representations and are not necessarily drawn to scale.

DETAILED DESCRIPTION OF ILLUSTRATIVE EMBODIMENTS

Figure 1:
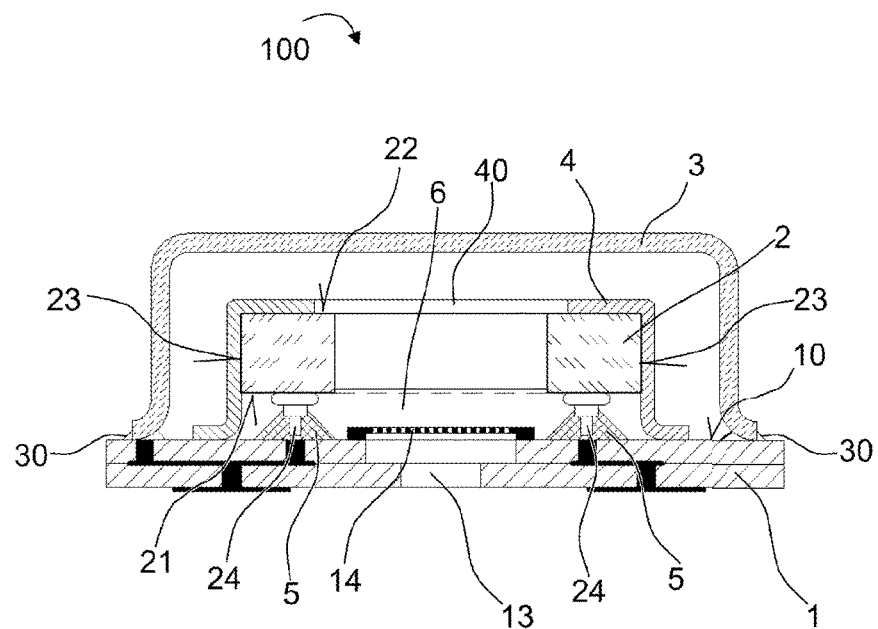
FIG. 1 shows an electronic device according to an embodiment.

FIG. 1 shows an electronic device 100 according to an embodiment. The electronic device 100 is formed as an electronic package and comprises a carrier board 1 having an upper surface 11, on which an electronic chip 2 is mounted, and a lower surface 12 remote from the upper surface 11, on which contacts are provided for externally contacting the electronic device 100. The electronic chip 2 can, for example, be a sensor chip and, preferably, a MEMS chip such as a MEMS microphone. Although the following description is related to such application, the present invention is not limited to MEMS microphones, but can also be useful for other types of stress sensitive sensors as well as electronic components in general.

A laminated multilayer board, for example, based on HTCC, LTCC, polymer or glass, serves as the carrier board 1 and, thus, as a package substrate. Conductor lines and vias provide electrical routing between the elements and the external solder pads. Ground planes can improve electromagnetic shielding in combination with a cap 3, preferably a metal cap, attached to the carrier board 1 by means of suitable connecting material 30, for example, a solder or a conductive adhesive.

The electronic chip 2 has a mounting side 21 facing the upper surface 11 of the carrier board 1. Furthermore, the electronic chip 2 has a top side 22 facing away from the upper surface 11, and sidewalls 23 connecting the mounting side 21 to the top side 22. The electronic chip 2, which is embodied as a MEMS microphone chip as explained above, is mounted on the carrier board 1 such that a membrane and a back plate of the chip 2 are facing an opening 13 in the carrier board 1, which serves as a sound port opening. As shown in FIG. 1, as an additional and optional element a barrier layer 14 can be applied on the opening 13. The barrier layer 14 can be a particle and/or humidity barrier which can seal the opening 13 to prevent the intrusion of dust or water. In particular, the optional barrier layer 14 can be formed by a mesh. Other embodiments encompass structures that are not attached to the carrier board 1, but to the electronic chip 2. Alternatively, no barrier layer 14 can be present.

For acoustical reasons, the sound port opening on the topmost carrier board layer should be as wide as possible. This limits the remaining area underneath the electronic chip 2 drastically. Therefore, the electronic chip 2 comprises stud bumps 24 on electrode pads, wherein the stud bumps 24 form electro-mechanical joining elements with an inherent flexibility, a low profile, and a small footprint. Each of the stud bumps 24 has a tail on top of a bump and is at least partly accommodated in a drop of a conductive adhesive 5 on the upper surface 11 of the carrier board 1, thereby providing a stress decoupling between the carrier board 1 and the electronic chip 2. Preferred heights of the stud bumps, including the tail and an optional portion accommodated in a recess as explained below, lie between 30 µm and 180 µm, wherein the limits are included. The stud bumps 24 can be manufactured using Au wire with a diameter of equal to or greater than 12 µm and equal to or less than 30 µm. The stud bumps 24 are produced by a modified wire bonding equipment. They can be set at high rates (up to ~30/s) directly on Al pads and do not require expensive UBM processing, which is often undesired in MEMS wafer processes.

All surfaces relevant for good electrical contact at the interface to the conductive adhesive 5 are preferably coated with a noble metal, for instance Au, Pt, Pd, Ag or alloys thereof, to provide low and stable resistance. The conductive adhesive 5 can be a thermoplastic or thermosetting resin as, for example, silicone, acrylate, epoxy or other suitable resin, which is filled with conductive particles, for instance Ag and/or Pd particles, or, in case of MEMS microphones or other capacitive sensors, other filler materials like carbon. Also, inherently conductive polymers are an alternative. The conductive adhesive 5 can be applied by dipping the stud bumps 24 in a "wet" layer of controlled thickness before placing the electronic chip 2 onto the carrier board 1. Also deposition by printing, jetting or dispensing can be used, which can provide higher volumes at better reproducibility.

The desired mechanical properties of the cured adhesive 5 widely depend on parameters like expected stress level and sensitivity, CTE (coefficient of thermal expansion) mismatch of involved materials, number of stud bumps per chip, height of the stud bumps, and others. In many configurations, a Young's modulus equal to or less than 500 MPa or preferably equal to or less than 100 MPa for the adhesive 5 is suitable. As for the carrier board CTE, values of equal to or less than 8 ppm/K or better equal to or less than 5 ppm/K should be targeted. But even low performance substrate material with a CTE up to 14 ppm/K may be used.

Owing to the stud bumps 24, problems of other connecting methods can be avoided. It is, for example, practically impossible to implement metal spring elements for realizing the required stress decoupling. In such case, conventional chip solder bumps would be attached to the free standing terminals of the spring elements, while the further terminals of the spring elements are fixed to the carrier board contacts. The gap height between the mounting surface of the chip and the upper surface of the carrier board is limited to roughly 100 µm, allowing no complex spring constructions in the vertical direction. Furthermore, it could not be avoided that parts of the spring structures would protrude from the chip outline, so that they would be obstructed by whatever means are used to separate the front and back volume. Furthermore, a conventional flip chip underfill would be even worse in this regard. Of course, a complete underfill would be prohibitive for a MEMS microphone, but even underfilling in the form of a dam along the chip edges would block the springs completely.

Compared to conventional solder bumps, the stud bumps 24 form joints which show a lower bond strength, particularly in case of a low number of joints per chip as given for a MEMS microphone and explained below. However, a reinforcement by means of an underfilling method cannot be used for MEMS microphones, since flow and bleeding towards functional parts during the application of the underfill material are harmful. Thus, the clearance 6 between the mounting side of the electronic chip and the upper surface of the carrier board is free of any underfill material. Rather than using an underfill, the electronic device 100 comprises a laminated polymer hood 4. The polymer hood at least partly covers the top side 22 of the electronic chip 2 and extends onto the upper surface 11 of the carrier board 1. In particular, the polymer hood 4 is fixedly connected by adhesion to a part of the upper surface 11 so that the laminated polymer hood 4 mechanically holds and supports the electronic chip 2. In the shown embodiment, the polymer hood 4 mechanically holds and supports the electronic chip 2 on all sidewalls 23 of the chip 2. Particularly preferably, the polymer hood 4 comprises a B-stage material, which combines a workability under thermoplastic conditions with a transformation to a thermosetting status during a final thermal and/or radiative cure, and has a thickness of equal to or greater than 10 µm and equal to or less than 80 µm. A preferred thickness can be about 20 µm. In order to not compromise the flexibility of the electronic device 100, the polymer hood 4, i.e., the laminated foil in the cured and finalized state constituting the polymer hood 4, preferably has a Young's modulus of equal to or less than 1 GPa at room temperature.

The lamination process is based on a heat-enhanced deep drawing driven by air pressure difference above and below a polymer foil. As a result, the only effective force on the stud bumps 24 is directed straight downwards, i.e., towards the upper surface 11 of the carrier board 1, this being their single resilient loading direction. The reason is that the tails of the stud bumps 24 can rest on the carrier board 1, thereby providing a mechanical stopper. All other load scenarios, for example, forces caused by bending, shearing, and/or pulling, that could easily destroy the stud bump joint can be handled by the polymer hood 4 after the curing process. An additional advantage of this assembly is its moderate temperature profile. While lead-free solder bumps require about 250° C. for reflow processes, typical conductive adhesives cure at about 150° C., wherein about 60° C. is also possible. Therefore, a low initial stress level is introduced upon mounting of the chip 2.

The polymer hood 4 also can provide a separation between the front and back volume of the electronic chip 2. In case of the explained MEMS microphone, the polymer hood 4 can have an opening 40 in the area of the MEMS cavity as a connection to the extended backvolume provided by the cap 3.

Figure 2:
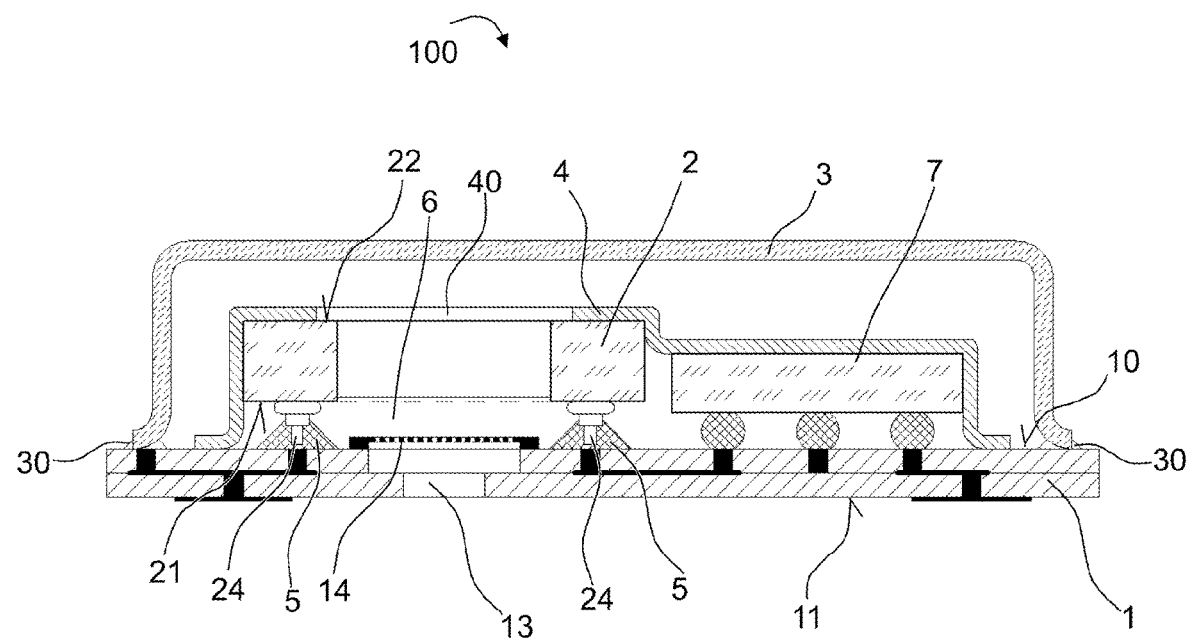
FIG. 2 shows an electronic device according to another embodiment.

FIG. 2 shows a further embodiment of an electronic device 100, which, in contrast to the previous embodiment, additionally comprises an ASIC 7, which is mounted on the carrier board 1. The ASIC 7 can support and control the function the electronic chip 2 and, thus, of the electronic device 100. The ASIC 7 can be mounted beside the electronic chip 2 under the polymer hood 4, as shown in FIG. 2, or outside of it. It may make use of the described joint elements in form of the stud bumps or any other mounting and interconnecting method, for example, flip chip attach with solder balls, conventional die attach with wire bonds, or others. In the shown embodiment, the polymer hood 4 covers, also in the presence of the ASIC 7 under the polymer hood 4, at least three of the four sidewalls 23 of the electronic chip 2, thereby sufficiently mechanically holding the electronic chip 2.

Figure 3A:
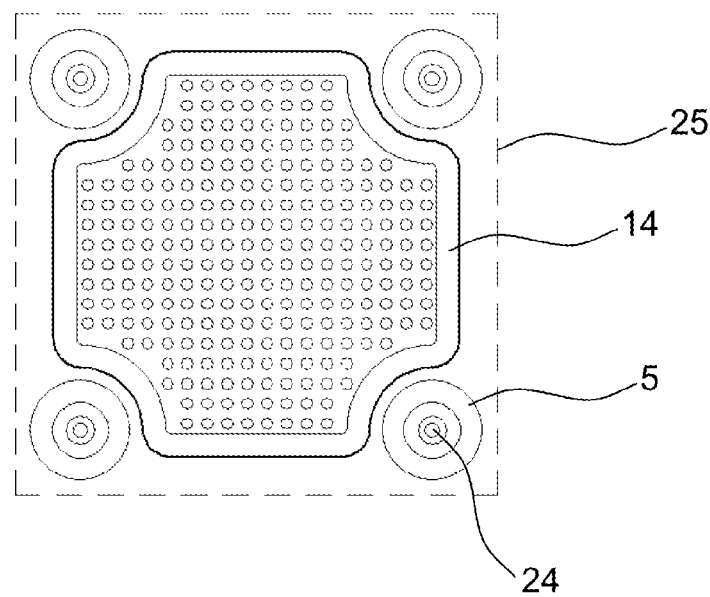
FIGS. 3A and 3B show further features of an electronic device according to further embodiments.
Figure 3B:
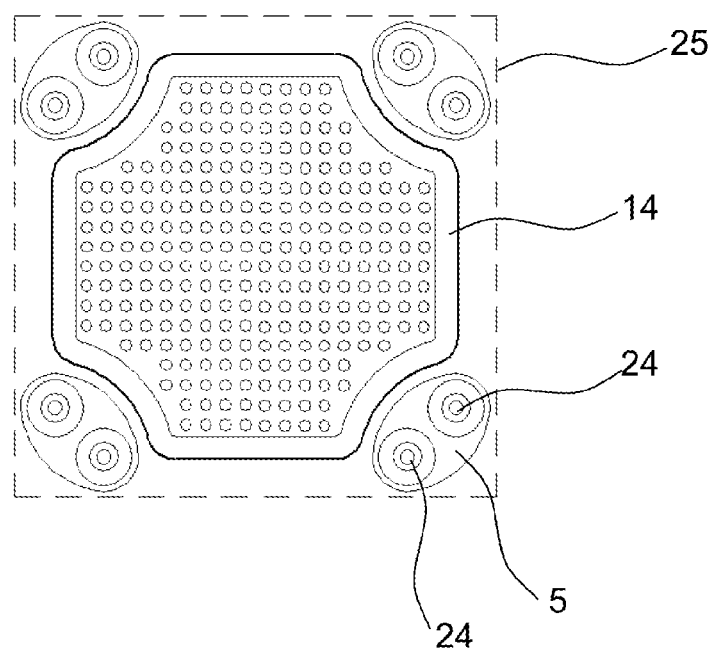

In the embodiments of FIGS. 1 and 2, the electronic chip 2 comprises equal to or less than 5 stud bumps per square millimeter of the base area of the mounting side, respectively. Considering typical sizes of MEMs chips, this can in particular mean that the electronic chip 2 has equal to or less than 10 stud bumps. In FIGS. 3A and 3B two exemplary embodiments for the layout of the electronic device 100 are shown. In both Figures the outline 25 of the electronic chip, which has, by way of example, a square shape, is illustrated by the dashed line. Also shown are the positions of the stud bumps 24, the conductive adhesive 5 and the (optional) barrier layer 14 covering the opening in the carrier board. FIG. 3A shows a layout with four stud bumps 24 squeezed into the corners of the available field, limited by the outline 25 of the electronic chip, in order to lose as little as possible of the area for the sound port opening 13 and the barrier layer 14. The respective outermost circle around the stud bumps 24 indicates the size of the conductive adhesive 5 on the carrier board, which preferably does not come in contact with the polymer hood in order to minimize possible leakage currents in this extremely high impedance circuitry. FIG. 3B shows a further embodiment with two stud bumps 24 forming one joint in each of the corners to strengthen the connection. Also more than two stud bumps are possible in each of the corners.

Figure 4:
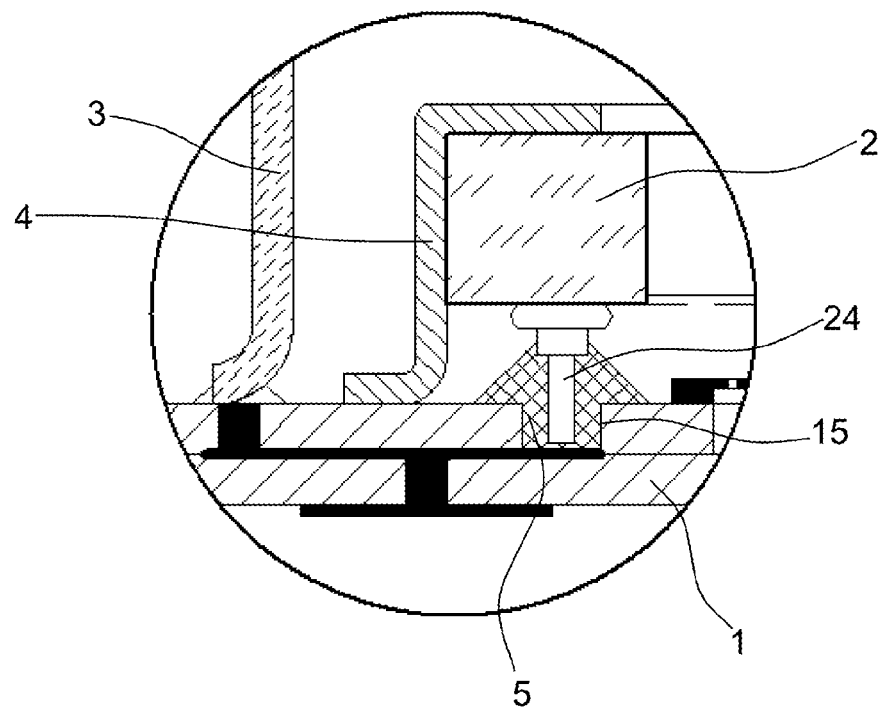
FIG. 4 shows a detail of an electronic device according to another embodiment.

FIG. 4 shows a detail of an electronic device according to another embodiment. In this embodiment, the carrier board 1 has at least one recess 15, in which at least one stud bump 24, or at least its elongated tail wire, is accommodated. The recess 15 is filled with the conductive adhesive 5. Alternatively to the shown embodiment, the recess 15 can be built by other means, for example, by structures on the upper surface of the carrier board 1, in particular solder mask patterns.

Figure 5A:
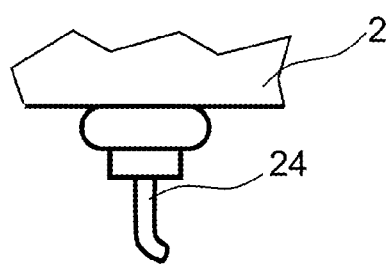
FIGS. 5A to 5C show details of stud bumps of an electronic device according to further embodiments.
Figure 5B:
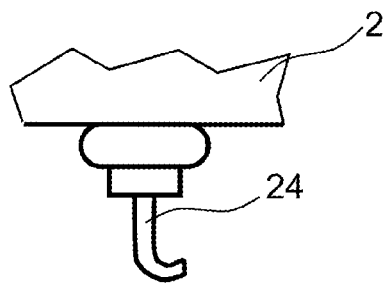
Figure 5C:
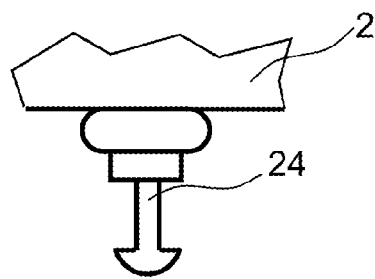

Further improvement can be achieved if at least one or several or all of the stud bumps and, in particular, their tails have a form-locking profile for a stronger anchoring in the relatively soft conductive adhesive. Exemplary embodiments for form-locking profiles are shown in FIGS. 5A to 5C. For example, the tail can bend at the end, as shown in FIG. 5A, or be formed as a hook or a bracket, as shown in FIG. 5B. Alternatively, coining the tail to a mushroom shape, as shown in FIG. 5C, is a preferred possibility.

Alternatively or additionally to the features described in connection with the figures, the embodiments shown in the figures can comprise further features described in the general part of the description. Moreover, features and embodiments of the figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. An electronic device comprising:
   a carrier board having an upper surface; and
   an electronic chip mounted on the upper surface, the electronic chip having a mounting side facing the upper surface of the carrier board, a top side facing away from the upper surface, and sidewalls connecting the mounting side to the top side,
   wherein the electronic chip has equal to or less than 5 stud bumps per square millimeter of a base area of the mounting side,
   wherein the carrier board has at least one recess in the upper surface, and
   wherein at least one of the stud bumps reaches into the recess.

2. The electronic device according to claim 1, further comprising a polymer hood covering at least three sidewalls of the electronic chip.

3. The electronic device according to claim 1, wherein the stud bumps are connected to the upper surface of the carrier board by a conductive adhesive.

4. The electronic device according to claim 3, wherein the conductive adhesive has a Young's modulus of equal to or less than 500 MPa.

5. The electronic device according to claim 3, wherein the conductive adhesive has a Young's modulus of equal to or less than 100 MPa.

6. The electronic device according to claim 1, wherein the mounting side of the electronic chip is located at a distance from the upper surface of the carrier board thereby defining a clearance between the mounting side and the upper surface, and wherein the clearance is free of any underfill material.

7. The electronic device according to claim 1, wherein at least one of the stud bumps has a form-locking profile.

8. The electronic device according to claim 1, wherein at least one of the stud bumps has a height of equal to or greater than 30 µm and equal to or less than 180 µm.

9. The electronic device according to claim 1, further comprising a laminated polymer hood at least partly covering the top side of the electronic chip and extending onto the upper surface of the carrier board.

10. The electronic device according to claim 9, wherein the polymer hood comprises a B-stage material.

11. The electronic device according to claim 9, wherein the polymer hood has a thickness of equal to or greater than 10 µm and equal to or less than 80 µm.

12. The electronic device according to claim 9, wherein the polymer hood has a Young's modulus of equal to or less than 1 GPa at room temperature.

13. The electronic device according to claim 1, wherein the electronic chip is a sensor chip.

14. The electronic device according to claim 1, wherein the electronic chip is a MEMS chip.

15. The electronic device according to claim 7, wherein the form-locking profile comprises a tail that is a hook or a bracket, or that has a mushroom shape.

16. An electronic device comprising:
   a carrier board having an upper surface; and
   an electronic chip mounted on the upper surface, the electronic chip having a mounting side facing the upper surface of the carrier board, a top side facing away from the upper surface, and sidewalls connecting the mounting side to the top side,
   wherein the electronic chip has equal to or less than 5 stud bumps per square millimeter of a base area of the mounting side, wherein the stud bumps are connected to the upper surface of the carrier board by a conductive adhesive, and wherein the conductive adhesive has a Young's modulus of equal to or less than 500 MPa.

* * * * *